United States Patent
Drumm (10) Patent No.: US 6,826,740 B2
(45) Date of Patent: Nov. 30, 2004

(54) AUTOMATED BUFFER INSERTION INCORPORATING CONGESTION RELIEF FOR USE IN CONNECTION WITH PHYSICAL DESIGN OF INTEGRATED CIRCUIT

(75) Inventor: Anthony DeGroff Drumm, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 112 days.

(21) Appl. No.: 10/140,517

(22) Filed: May 7, 2002

(65) Prior Publication Data

US 2003/0212976 A1 Nov. 13, 2003

(51) Int. Cl.$^7$ .............................................. G06F 17/50
(52) U.S. Cl. ........................ 716/12; 716/13; 716/14; 716/10
(58) Field of Search .............................. 716/12, 13–18, 716/1–11

(56) References Cited

U.S. PATENT DOCUMENTS

| | | | |
|---|---|---|---|
| 5,825,661 A | | 10/1998 | Drumm ...................... 364/491 |
| 5,974,245 A | * | 10/1999 | Li et al. ........................ 716/10 |
| 6,282,693 B1 | * | 8/2001 | Naylor et al. .................. 716/8 |
| 6,286,128 B1 | * | 9/2001 | Pileggi et al. ................ 716/18 |
| 6,351,840 B1 | * | 2/2002 | Teng .............................. 716/7 |
| 6,367,051 B1 | * | 4/2002 | Pileggi et al. ................. 716/2 |
| 6,487,697 B1 | * | 11/2002 | Lu et al. ........................ 716/2 |
| 6,493,658 B1 | * | 12/2002 | Koford et al. ................. 703/1 |
| 6,493,854 B1 | * | 12/2002 | Chowdhury et al. ........... 716/6 |
| 6,502,222 B1 | * | 12/2002 | Tetelbaum ..................... 716/4 |
| 6,505,336 B1 | * | 1/2003 | Andreev et al. .............. 716/14 |
| 6,510,542 B1 | * | 1/2003 | Kojima ........................ 716/10 |
| 6,532,580 B1 | * | 3/2003 | Josephson et al. ............ 716/10 |
| 6,557,145 B2 | * | 4/2003 | Boyle et al. .................... 716/2 |
| 6,615,401 B1 | * | 9/2003 | Gasanov et al. .............. 716/12 |
| 6,634,014 B1 | * | 10/2003 | Lindberg et al. ............... 716/6 |
| 2001/0010090 A1 | * | 7/2001 | Boyle et al. .................... 716/2 |
| 2003/0182649 A1 | * | 9/2003 | Harn .......................... 716/11 |
| 2003/0221176 A1 | * | 11/2003 | Andreev et al. ............... 716/7 |

OTHER PUBLICATIONS

Tang, Xiaoping et al, "A New Algorithm for Routing Tree Construction with Buffer Insertion and Wire Sizing under Obstacle Constraints", IEEE/ACM International Conference on Computer Aided Design, ICCAD 2001,Nov. 4–11, 2001, pp. 49–56.*

C.J. Alpert, A. Devgan, S. Quay; "Buffer Insertion with Accurate Gate and Interconnect Delay Computation", no date.

C. Alpert, A. Devgan; "Wire Segmenting for Improved Buffer Insertion", no date.

I. Liu, A. Aziz, D.F. Wong, H. Zhou; "An Efficient Buffer Insertion Algorithm for Large Networks Based on Lagrangian Relaxation", no date.

* cited by examiner

*Primary Examiner*—A. M. Thompson
*Assistant Examiner*—Magid Y. Dimyan
(74) *Attorney, Agent, or Firm*—Wood, Herron & Evans, LLP (57) ABSTRACT

An apparatus, program product and method use a congestion relief algorithm in connection with automated buffer insertion to relieve potential congestion during post-layout interconnect routing. The congestion relief algorithm is utilized to manipulate a plurality of L-shaped spans defined in a routing tree, and is configured to apply the congestion relief algorithm to at least a first L-shaped span among the plurality of L-shaped spans by rerouting the first L-shaped span at least partially within a rectangular area bounded by the first L-shaped span.

34 Claims, 3 Drawing Sheets

AUTOMATED BUFFER INSERTION INCORPORATING CONGESTION RELIEF FOR USE IN CONNECTION WITH PHYSICAL DESIGN OF INTEGRATED CIRCUIT

FIELD OF THE INVENTION

The invention is generally related to integrated circuits and integrated circuit design, and in particular to automated buffer insertion during physical design of integrated circuits.

BACKGROUND OF THE INVENTION

Electronic integrated circuits, or "chips" have become significantly more complex as circuit fabrication technologies have improved. It is not uncommon for integrated circuits to incorporate hundreds of millions of transistors, with a comparable number of interconnects, or signal paths, integrated together onto a single piece of silicon substrate no larger than the size of a coin. In addition, often the same functionality that once required multiple chips can now be integrated onto the same chip, a concept often referred to as "system-on-chip" technology.

The design of integrated circuits has likewise become more difficult as complexity has increased. Whereas early chips were often designed gate by gate, more advanced integrated circuits incorporating millions of gates represent too much of an undertaking for early design methodologies. Likewise, another important aspect of integrated circuit design is that of testing and verifying an integrated circuit design, both from the standpoint of verifying that a design will logically operate as intended, and of ensuring that a design will comply with the physical limitations that are inherent in any integrated circuit, i.e., to ensure that all timing and delay constraints are met.

As a result, a variety of software design applications, or tools, have been developed to assist designers with designing and testing integrated circuits.

Generally when utilizing these tools, the overall design process is represented by two stages. The first stage is referred to as logic design, where the desired functional operation of an integrated circuit is initially defined and tested. The second stage is referred to as physical design, where the logic design created during the logic design stage is processed to select actual circuit components to implement the functions defined in the logic design, and to lay out the components on an integrated circuit and route interconnects therebetween. The interconnections between circuit elements are often referred to as nets, and the nets are generally routed afer placement of circuit components at specific locations on an integrated circuit.

One important parameter that must be accounted for during the design of an integrated circuit is that of timing. In particular, due to factors such as resistance, capacitance, switching delays, etc., signals that are propagated through an integrated circuit require some finite amount of time to reach various destinations. In any given integrated circuit design, however, often signals must reach destinations within a certain time frame (typically before the end of a clock cycle), lest data be missed due its late arrival at a destination. Timing particularly becomes troublesome for relatively long interconnects, as the inherent resistance and capacitance of such interconnects may delay the arrival of a signal on a long interconnect beyond that which is acceptable under the normal operating conditions for an integrated circuit.

Timing is often accounted for in both the logic and physical design stages of an integrated circuit. However, during the logic design stage, timing parameters for the various nets in a design are typically estimated using formulas, and these estimates are often not particularly accurate. Timing analysis is also performed during the physical design stage, and a developer may be required to refine a design after timing analysis if it is determined during the physical design stage that timing parameters are not acceptable.

Given the rather gross estimates made during the logic design stage, it is not uncommon for an integrated circuit design to meet timing constraints in the logic design stage, but not meet the timing constraints after layout and routing during the physical design stage. As a result, various types of post-layout optimization algorithms are often utilized to address many of these timing problems in an automated manner. By doing so, a designer may not be required to return to the logic design stage for manual refinements of a design, which can substantially simplify the design process.

One such type of post-layout optimization is automated buffer insertion. In particular, the addition of one or more inverting or non-inverting buffers into a relatively long interconnect in an integrated circuit design will typically improve the timing parameters for that interconnect due to reduced load, reduced delay, and reduced slew, and often without altering the overall length of an interconnect. Thus, by the selective addition of buffers to a design, often previously non-compliant designs can be optimized in an automated manner to bring those designs into compliance with timing constraints.

Most conventional automated buffer insertion algorithms place buffers using a pre-existing routing tree. A routing tree is typically created for each "net" in a design, i.e., for each interconnect between a signal source and one or more signal sinks. In many instances, each routing tree is configured as a Steiner tree, which attempts to generate the shortest orthogonal path or "route" between any source and its sinks. Additional points, known as Steiner points, are typically added to routes so that, between any non-orthogonal nodes along a route, interconnect segments are routed in a vertical-horizontal or horizontal-vertical manner, thus creating one or more L-shaped spans between a source and its sinks.

One problem associated with many conventional automated buffer insertion algorithms, however, typically arises when a relatively large number of similar nets need to be routed, with all of the sources for those nets disposed in one small region and all of the sinks for those nets disposed in another small region, e.g., for a bus or similar multi-signal interface. In such an instance, where all of the Steiner routes are similar, the locations for the buffers added by a conventional automated buffering insertion process will typically be located in approximately the same locations. Then, once the buffers are placed, the subsequent routing of interconnects is substantially constrained, causing difficulties associated with routing a large number of interconnects through the same general region of an integrated circuit.

Put another way, without the buffers, a router is free to select any orthogonal path to traverse from each source to each corresponding sink. Moreover, as tracks fill, the router can use different equivalent routes. However, after buffers are inserted, the router is forced to follow nearly the same path for all nets, since it must work its way through the buffers. As a result, the placement of the buffers essentially defines the routes. Consequently, substantial congestion may arise in particular regions of an integrated circuit design due to the placement of buffers in close proximity to one another. Conventional automated buffer insertion algorithms have thus been found to cause significant congestion in many integrated circuit designs in the instances where a number of relatively long interconnects are required to be routed between roughly the same regions on an integrated circuit design.

Therefore, a significant need exists in the art for a manner of relieving congestion in an integrated circuit design caused by the placement of buffers as a result of automated buffer insertion performed during post-layout optimization of an integrated circuit design.

SUMMARY OF THE INVENTION

The invention addresses these and other problems associated with the prior art by providing an apparatus, program product and method in which a congestion relief algorithm is used in connection with automated buffer insertion to relieve potential congestion during post-layout optimization of an integrated circuit design. The congestion relief algorithm is utilized to manipulate a plurality of L-shaped spans defined in a routing tree, and is configured to apply the congestion relief algorithm to at least a first L-shaped span among the plurality of L-shaped spans by rerouting the first L-shaped span at least partially within a rectangular area bounded by the first L-shaped span.

A wide variety of algorithms may be used to reroute L-shaped spans at least partially through the respective rectangular areas bounded by such spans. For example, in the illustrated embodiments discussed below, an intermediate point is selected for an L-shaped span, and is positioned so as to reside within the rectangular area for the span. Two sub-spans are then defined, extending between the original end points of the span and the intermediate point. Each sub-span is then configured to be routed in either a vertical-horizontal routing or a horizontal-vertical routing.

When the aforementioned congestion relief algorithm is applied to one or more L-shaped spans of a routing tree, and particularly when such an algorithm is applied to multiple routing trees in an integrated circuit design, the potential for congestion to arise due to the insertion of buffers is substantially decreased. In addition, while other automated buffer insertion algorithms may be used in connection with the herein-described congestion relief algorithm, when an automated buffer insertion algorithm that places buffers on preexisting routing trees is utilized, the aforementioned congestion relief algorithm may be used to generate an optimized routing tree to ensure that buffers are more widely dispersed throughout an integrated circuit design by such an automated buffer insertion algorithm. As a result, subsequent automated routing of interconnects in the design experiences reduced congestion-related routing problems.

These and other advantages and features, which characterize the invention, are set forth in the claims annexed hereto and forming a further part hereof. However, for a better understanding of the invention, and of the advantages and objectives attained through its use, reference should be made to the Drawings, and to the accompanying descriptive matter, in which there is described exemplary embodiments of the invention.

DETAILED DESCRIPTION

The embodiments discussed herein apply a congestion relief algorithm in connection with automated buffer placement to reduce downstream congestion concerns during post-layout interconnect routing. A congestion relief algorithm consistent with the invention operates on an L-shaped span in a routing tree, which may be defined by any pair of adjacent, non-orthogonal points in a routing tree (i.e., adjacent points that are incapable of being coupled by a single vertical or horizontal interconnect in an orthogonal routing environment). When applied to multiple L-shaped spans, particularly those in which the end points of the spans are in relatively close proximity, a congestion relief algorithm will typically select different routes for at least a portion of the spans so that, when automated buffer insertion is performed, buffers will be placed along the different routes and thus be dispersed more extensively throughout a region.

Figure 1:
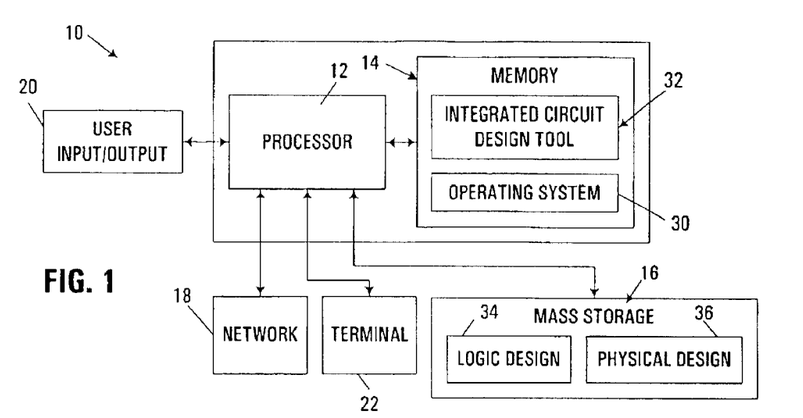
FIG. 1 is a block diagram of an apparatus hosting an integrated circuit design tool suitable for performing automated buffer insertion in a manner consistent with the invention.

Turning now to the Drawings, wherein like numbers denote like parts throughout the several views, FIG. 1 illustrates an exemplary hardware and software environment for an apparatus 10 suitable for implementing automated buffer insertion in a manner consistent with the invention. For the purposes of the invention, apparatus 10 may represent practically any type of computer, computer system or other programmable electronic device, including a client computer, a server computer, a portable computer, a hand-held computer, an embedded controller, etc. Moreover, apparatus 10 may be implemented using one or more networked computers, e.g., in a cluster or other distributed computing system. Apparatus 10 will hereinafter also be referred to as a "computer", although it should be appreciated the term "apparatus" may also include other suitable programmable electronic devices consistent with the invention.

Computer 10 typically includes at least one processor 12 coupled to a memory 14. Processor 12 may represent one or more processors (e.g., microprocessors), and memory 14 may represent the random access memory (RAM) devices comprising the main storage of computer 10, as well as any supplemental levels of memory, e.g., cache memories, non-volatile or backup memories (e.g., programmable or flash memories), read-only memories, etc. In addition, memory 14 may be considered to include memory storage physically located elsewhere in computer 10, e.g., any cache memory in a processor 12, as well as any storage capacity used as a virtual memory, e.g., as stored on a mass storage device 16 or on another computer coupled to computer 10 via network 18.

Computer 10 also typically receives a number of inputs and outputs for communicating information externally. For interface with a user or operator, computer 10 may include one or more user input/output devices 20 (e.g., for input, a keyboard, a mouse, a trackball, a joystick, a touchpad, and/or a microphone; and for output, a CRT monitor, an LCD display panel, and/or a speaker, among others). Otherwise, user input may be received via a remote terminal or workstation 22, and/or via another computer interfaced with computer 10 over network 18.

For additional storage, computer 10 may also include one or more mass storage devices 16, e.g., a floppy or other removable disk drive, a hard disk drive, a direct access storage device (DASD), an optical drive (e.g., a CD drive, a DVD drive, etc.), and/or a tape drive, among others. Furthermore, computer 10 may include an interface with one or more networks 18 (e.g., a LAN, a WAN, a wireless network, and/or the Internet, among others) to permit the communication of information with other computers coupled to the network. It should be appreciated that computer 10 typically includes suitable analog and/or digital interfaces between processor 12 and each of components 14, 16, 18, 20 and 22 as is well known in the art.

As is common in connection with integrated circuit design, computer 10 is typically a multi-user computer such as a server, midrange computer, mainframe computer, with user input and output conducted with circuit designers and testers via one or more external computers coupled to computer 10 via a terminal or a networked computer. However, the invention is not limited to such an environment.

Computer 10 operates under the control of an operating system 30, and executes or otherwise relies upon various computer software applications, components, programs, objects, modules, data structures, etc. (e.g., integrated circuit design tool 32, among others). Moreover, various applications, components, programs, objects, modules, etc. may also execute on one or more processors in another computer coupled to computer 10 via a network 18, e.g., in a distributed or client-server computing environment, whereby the processing required to implement the functions of a computer program may be allocated to multiple computers over a network.

In general, the routines executed to implement the embodiments of the invention, whether implemented as part of an operating system or a specific application, component, program, object, module or sequence of instructions, or even a subset thereof, will be referred to herein as "computer program code," or simply "program code." Program code typically comprises one or more instructions that are resident at various times in various memory and storage devices in a computer, and that, when read and executed by one or more processors in a computer, cause that computer to perform the steps necessary to execute steps or elements embodying the various aspects of the invention. Moreover, while the invention has and hereinafter will be described in the context of fully functioning computers and computer systems, those skilled in the art will appreciate that the various embodiments of the invention are capable of being distributed as a program product in a variety of forms, and that the invention applies equally regardless of the particular type of signal bearing media used to actually carry out the distribution. Examples of signal bearing media include but are not limited to recordable type media such as volatile and non-volatile memory devices, floppy and other removable disks, hard disk drives, magnetic tape, optical disks (e.g., CD-ROM's, DVD's, etc.), among others, and transmission type media such as digital and analog communication links.

In addition, various program code described hereinafter may be identified based upon the application or tool within which it is implemented in a specific embodiment of the invention. However, it should be appreciated that any particular program nomenclature that follows is used merely for convenience, and thus the invention should not be limited to use solely in any specific application identified and/or implied by such nomenclature. Furthermore, given the typically endless number of manners in which computer programs may be organized into routines, procedures, methods, modules, objects, and the like, as well as the various manners in which program functionality may be allocated among various software layers that are resident within a typical computer (e.g., operating systems, libraries, API's, applications, applets, etc.), it should be appreciated that the invention is not limited to the specific organization and allocation of program functionality described herein.

Automated buffer insertion consistent with the invention is typically implemented within an integrated circuit design environment that includes a tool 32, which may be used to initially develop and test a logic design 34 (shown resident in mass storage 16), and then generate and test from that logic design 34, a physical design 36 (also shown resident in mass storage 16), suitable for use in manufacturing an integrated circuit. However, it should be appreciated that the various functions associated with designing and testing an integrated circuit may be handled by different computer programs that collectively represent the functionality of integrated circuit design tool of FIG. 1. Different collections of computer programs, incorporating different design and/or testing functionality, may be used in other embodiments, and may or may not be integrated together into a common tool or suite. As such, the invention is not limited to implementation within the particular collection of computer programs described herein.

Figure 2:
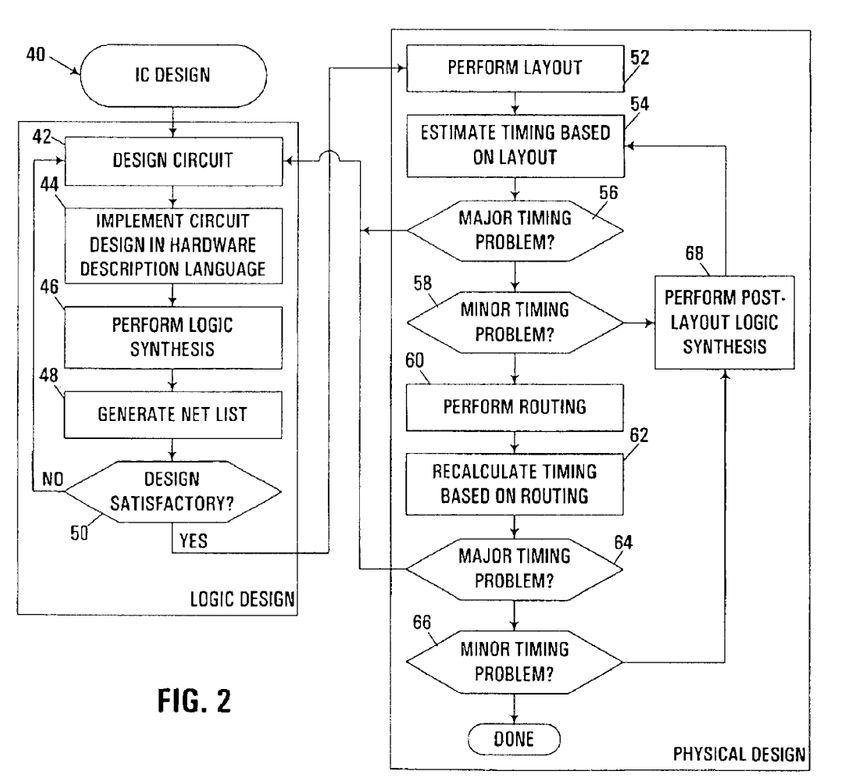
FIG. 2 is a flowchart illustrating an integrated circuit design process performed using the integrated circuit design tool of FIG. 1.

FIG. 2 next illustrates the principal steps in an exemplary integrated circuit design process using the integrated circuit design tool of FIG. 1. In particular, an integrated circuit design process 40 includes a plurality of blocks 42–68, with blocks 42–50 representing the logic design stage of integrated circuit design, and blocks 52–68 representing the physical design stage of integrated circuit design.

During the logic design stage, the desired circuit is initially designed or created in block 42. Thereafter, the circuit design is implemented in a hardware description language such as Verilog or VHDL in block 44. Next, logic synthesis is performed in block 46, e.g., to estimate the timing for each net in the circuit based upon the number and types of circuit elements connected to the net. Next, in block 48, a net list is generated, representing a detailed listing of all circuit elements and their interconnections to implement the desired circuit design. Based upon the net list, block 50 determines whether the design is satisfactory. If not, additional circuit design is performed by returning to block 42.

Otherwise, if the design is satisfactory, the physical design stage is entered, starting with layout of the circuit elements in block 52. During layout, the elements created during the logic design stage are placed in appropriate locations in an integrated circuit design.

Once layout is performed, a timing estimate is performed in block 54 based upon the layout. As mentioned above, the timing estimation performed in block 54 is generally more precise than the timing estimate performed during the logic design stage. Accordingly, from this estimate, both major and minor timing problems may be identified. Assuming first that no major or minor timing problems are identified, blocks 56 and 58 proceed to block 60 to route interconnects between all of the circuit elements laid out previously during the physical design stage. Timing is then recalculated based upon the new routing information in block 62. Assuming again that no major or minor timing problems are identified, blocks 64 and 66 do not divert the flow of process 40, whereby design of the integrated circuit is complete.

On the other hand, if a major timing problem is identified in either of blocks 56 or 64, an integrated circuit design generally must be returned to the logic design stage, and specifically block 42, to rework the design to correct any major problems. Otherwise, if a minor timing problem is identified after layout or routing, blocks 58 or 66 proceed to a post-layout optimization or logic synthesis step (block 68) to attempt to correct the minor timing problem. Generally, a minor problem is distinguished from a major problem in that a minor problem is capable of being corrected via an automated post-layout logic synthesis operation, whereas a major timing problem may require substantially more effort to correct.

The post-layout logic synthesis step in block 68 incorporates automated buffer insertion consistent with the invention, but may also incorporate any number of additional post-layout optimizations known in the art. In particular, various additional operations, e.g., other buffering, block copying, modifications to power levels, re-synthesis of portions of the circuit design, etc., may also be performed to alleviate any potential timing problems.

After post-layout logic synthesis, block 68 proceeds back to block 54 to revisit the timing characteristics of the now-modified physical design. This process then continues iteratively until no timing problems are detected in the design.

It will be appreciated that other design processes may be utilized in connection with automated buffer insertion consistent with the invention. Therefore, the invention is not limited to the particular process described herein.

Figure 3:
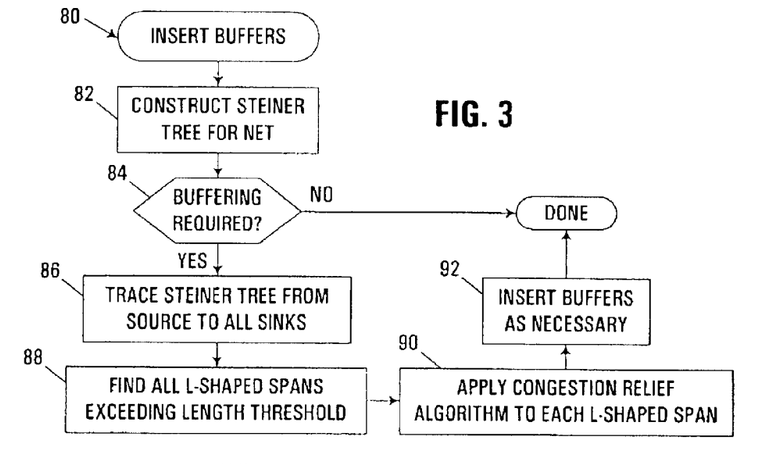
FIG. 3 is a flowchart illustrating the program flow of an insert buffer routine performed during the post-layout logic synthesis step referenced in FIG. 2.

As mentioned above, one of the operations capable of being performed during the post-layout logic synthesis of block 68 is automated buffer insertion. FIG. 3, for example, illustrates an insert buffers routine 80 suitable for performing automated buffer insertion in a manner consistent with the invention. Routine 80 is typically called during automated buffer insertion to process a particular net including a source and one or more sinks. As such, routine 80 is typically called for each net identified in the circuit design as posing a potential timing concern, or alternatively, for every net in the design irrespective of whether a timing concern has been raised for any particular net.

Routine 80 begins in block 82 by constructing a Steiner tree for the net, in a manner well known in the art. Next, block 84 determines whether buffering is required. For example, block 84 may determine if any span in the net exceeds a predetermined length threshold, or whether any other parameters associated with the net identify the potential for the addition of a buffer to alleviate a timing problem.

If block 84 determines that no buffering is required for the net, routine 80 is complete for that net. Otherwise, block 84 passes control to block 86 to trace the generated Steiner tree from the source to all sinks in the net. The result of block 86 is that one or more Steiner points are typically added to define one or more L-shaped spans between adjacent non-orthogonal points in the tree.

Next, block 88 identifies all L-shaped spans exceeding a predetermined length threshold. An L-shaped span is defined in this context to include a span in a Steiner tree that includes three points, where the middle, or "corner" point, is not a pin, but is instead a Steiner point added to complete a route between starting and ending points. Moreover, a qualifying L-shaped span will have only two segments extending from the corner point—one to the starting point and one to the ending point. As used hereinafter, labels A, B and C will be used to specify the starting point, "corner" point, and ending point for a particular L-shaped span.

Next, block 90 applies a congestion relief algorithm to each L-shaped span exceeding the length threshold, as determined in block 88. In this context, the length threshold may be selected so as to identify any routes that, based upon the inherent resistance and capacitance of interconnects using the particular fabrication technologies used to ultimately construct an integrated circuit based on the design, could potentially cause timing problems during normal operation.

Once the congestion relief algorithm is applied to each such span, block 92 then inserts buffers as necessary, using any number of criteria for placing a buffer as is well known in the art, e.g., using a Van Ginnekan buffer insertion algorithm or any other algorithm based thereupon. Routine 80 is then complete.

As discussed above, many automated buffer insertion algorithms place buffers using a Steiner tree, such that buffers are placed at selected nodes in a tree after the tree is generated. Routine 80 builds upon this aspect of such algorithms by preceding the insertion of buffers by the application of a congestion relief algorithm. The congestion relief algorithm re-routes selected L-shaped spans within a routing tree, such that the later buffer insertion performed in block 92 operates upon an optimized routing tree, rather than an otherwise unoptimized Steiner tree as is used by many such algorithms. By optimizing a routing tree prior to application of a buffer insertion algorithm, the buffer insertion algorithm used may be purely conventional in nature. However, in other embodiments, it may be desirable to incorporate the application of a congestion relief algorithm in connection with the actual placement of buffers by a buffer insertion algorithm, which may necessitate the use of an algorithm that differs from conventional algorithms that rely solely on a pre-existing routing tree to determine the appropriate location for inserted buffers.

Moreover, it will be appreciated that routine 80 applies a congestion relief algorithm to a pre-existing routing tree, and outputs an optimized routing tree that is used for subsequent buffer insertion. In other embodiments, however, the application of a congestion relief algorithm may be made concurrently with the initial generation of a routing tree.

In addition, it will be appreciated that routine 80 as illustrated is applied on a net-by-net basis during processing of an integrated circuit design during post-layout optimization. In other embodiments, however, it may be desirable to collectively process a plurality of nets and apply a congestion relief algorithm during the collective processing of such nets. In connection with this latter embodiment, it may be desirable to identify multiple nets that have the potential for congestion, e.g., through identification of a bus, or identification of multiple sinks and/or sources that are located in the same general region of an integrated circuit design.

A wide variety of congestion relief algorithms may be used in block 90 of routine 80. In general, a congestion relief algorithm consistent with the invention is utilized to selectively re-route selected L-shaped spans in a net such that such L-shaped spans are at least partially routed through a rectangular area bounded by such L-shaped spans. Thus, rather than applying a simple orthogonal vertical-horizontal routing or a horizontal-vertical routing between starting and ending points of an L-shaped span, an alternative routing is selected that at least partially enters the region bounded by the orthogonal paths between those points.

When applied to individual nets, collectively the selective re-routing of selected L-shaped spans will affect the congestion experienced by multiple nets. Specifically, rather than routing multiple nets that share closely proximate sources and/or sinks, the congestion relief algorithm described herein will selectively re-route each of the spans within each net, and thus relieve congestion throughout the area traversed by all such nets.

Figure 4:
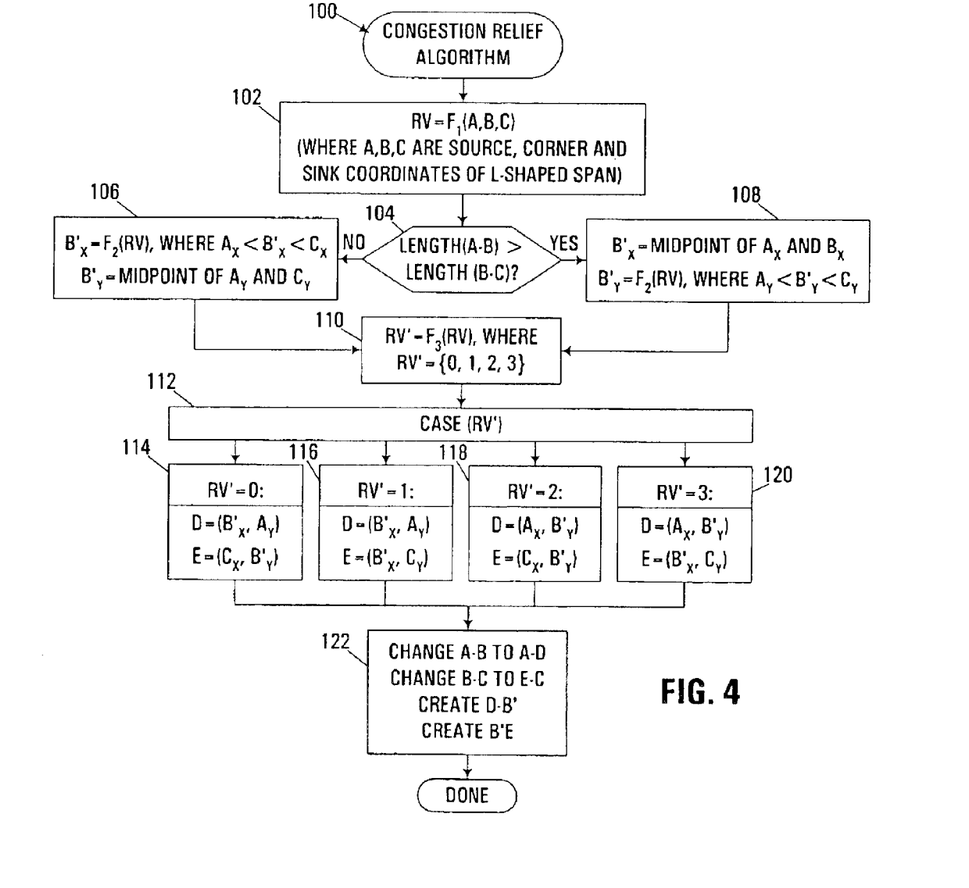
FIG. 4 is a flowchart illustrating an exemplary implementation of a congestion relief algorithm capable of being applied in the insert buffer routine of FIG. 3.

A wide variety of congestion relief algorithm implementations may be utilized consistent with the invention. FIG. 4, for example, illustrates one exemplary congestion relief algorithm 100, which generally operates by applying a pseudo-random function based upon the starting, ending and corner coordinates for an L-shaped span. In particular, block 102 applies a pseudo-random function $F_1$ to generate a random value (RV) based upon the x-y coordinates of each of a start point, corner point (i.e., the intersection for the two legs of an L-shaped span) and end point of an L-shaped span (which are respectively denoted as A, B, and C in FIG. 4). Any number of pseudo-random functions may be utilized for function $F_1$, including, for example, a linear congruential method, with it being desirable that the pseudo-random function generate a relatively large set of different values for different sets of coordinates, even when multiple L-shaped spans might be disposed in close proximity to one another in a Steiner tree. By ensuring that even closely located L-shaped spans will generate different RV values, a greater distribution of alternative routings may be selected, thus optimizing the distribution of interconnects through a potentially congested area.

Algorithm 100 creates an intermediate point (referred to herein as B') that is located within a rectangular region bounded by an L-shaped span, and in particular, along a bisecting line positioned at the midpoint of a longest segment in an L-shaped span, with the value of RV utilized to select a point along the bisecting line. As such, block 104 determines whether the segment between points A and B is longer than the segment between points B and C. If so, control passes to block 108 to set the x coordinate of point B' to the midpoint of the x coordinates of points A and B. The y coordinate of point B' is selected using a second function $F_2$ based upon the value of RV, so long as the y coordinate for point B' is located between the y coordinates of the A and C points. Otherwise, if the segment from point B to point C is longer, block 104 passes control to block 106 to set the y coordinate of point B' to the midpoint of the y coordinates of points A and C, and the x coordinate of point B' based upon function $F_2$, so long as the x coordinate is between the x coordinates of points A and C.

Function $F_2$ is selected so as to select a point along the bisecting line which is within the bounding rectangle A-C based upon the value of RV. A multitude of functions may be utilized, including a function in which the point is selected to be the position proportionally along the line based upon the ratio of RV to the possible range of RV values output by function $F_1$.

After the coordinates of the intermediate point are selected, each of blocks 106 and 108 passes control to block 110 to generate a second random value (RV') using a function $F_3$, based upon the first random value RV. RV' is set to one of the integers 0, 1, 2 and 3, setting up four possible routings using the selected intermediate point B'. In particular, block 112 passes control to one of blocks 114, 116, 118 and 120 based upon the selected value of RV'. It will be appreciated that the operation of function $F_3$ in selecting the four possible values of RV' may include any number of implementations, including implementations in which all four cases are equally represented, as well as others where certain cases are favored over others. For example a MOD 4 operation could be used, among others.

If the value of RV' is 0, block 114 is executed to generate two new points D and E, with point D set to have an x coordinate equal to that of intermediate point B', and a y coordinate equal to that of point A. Point E is set to have an x coordinate equal to that of point C, and a y coordinate equal to that of intermediate point B'.

In the case of RV' being 1, block 116 is executed to set point D to have an x coordinate equal to that of intermediate point B', and a y coordinate equal to that of point A. Point E is set to have an x coordinate equal to that of intermediate point B' and a y coordinate equal to that of point C.

For the case of RV' being 2, block 118 is executed to set point D to have an x coordinate equal to that of point A and a y coordinate equal to that of intermediate point B'. Point E is set to have an x coordinate equal to that of point C, and a y coordinate equal to that of intermediate point B'.

For the case of RV' being 3, block 120 is executed to set the x coordinate of point D to that of point A, and the y coordinate of point D to that of intermediate point B'. Point E is set to have an x coordinate equal to that of intermediate point B' and a y coordinate equal to that of point C.

After points D and E have been determined in one of blocks 114–120, control passes to block 122 to change segment A-B in the routing tree to be routed from A to point D, and to change segment B-C to be routed from point E to point C. In addition, two new segments, from point D to intermediate B' and from intermediate point B' to point E, are created in the routing tree. As such, the Steiner tree is modified to route at least a portion of the L-shaped span within the rectangular bounding region for the span.

Figure 5:
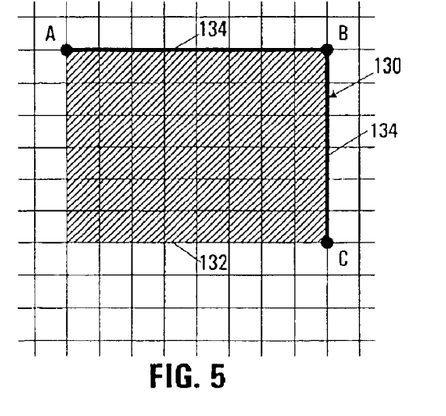
FIG. 5 is a block diagram of an exemplary L-shaped span capable of being rerouted by the congestion relief algorithm of FIG. 4.

FIGS. 5–10 illustrate the application of the congestion relief algorithm of FIG. 4 to an exemplary L-shaped span 130, as shown in FIG. 5. For the purposes of this example, it may be seen that points A, B and C of the exemplary L-shaped span 130 define and bound a rectangular region 132. In addition, two segments 134 are illustrated for L-shaped span 130, including an A-B segment and a B-C segment.

Figure 6:
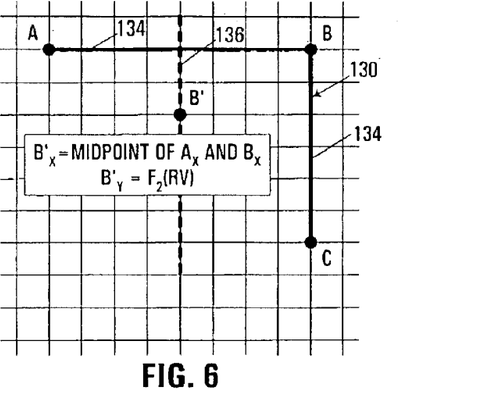
FIG. 6 is a block diagram of the exemplary L-shaped span of FIG. 6, after selection of an intermediate point by the congestion relief algorithm of FIG. 4.

FIG. 6 illustrates the general operation of blocks 102–108 of algorithm 100 in selecting an intermediate point B'. In particular, given that segment A-B is longer than segment B-C, the x coordinate of intermediate point B' is selected to be the midpoint of segment A-B, disposed along bisecting line 136. The y coordinate is selected as a function of value RV to be within the rectangular area bounded by segments A-B and B-C.

Figure 7:
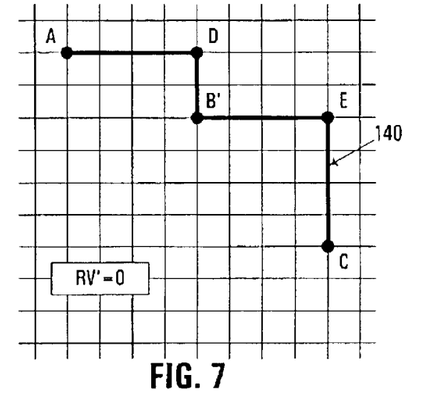
FIGS. 7–10 are block diagrams of four alternative routes of the exemplary L-shaped span capable of being selected by the congestion relief algorithm of FIG. 4, and using the intermediate point illustrated in FIG. 6.
Figure 8:
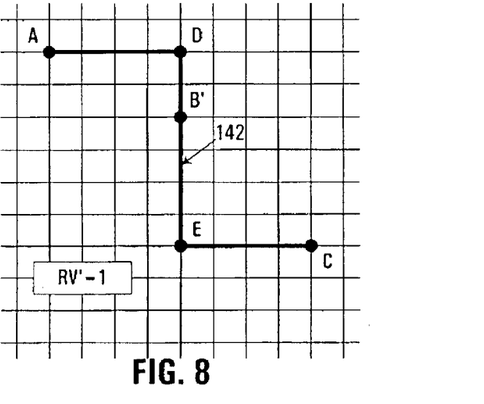
Figure 9:
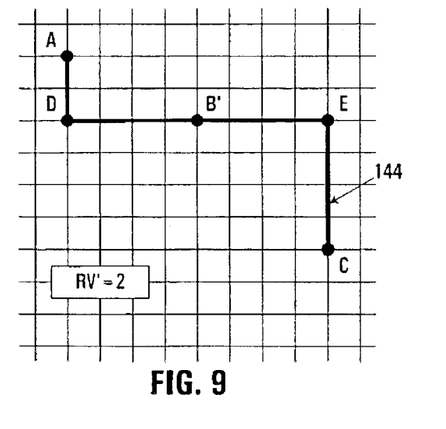
Figure 10:
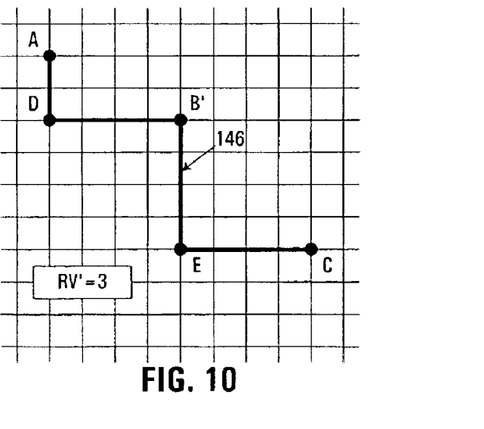

Given the selected intermediate point B', FIGS. 7–10 illustrate four alternative routings 140, 142, 144 and 146 generated in response to the value of the second random value RV' being one of 0, 1, 2 and 3. In particular, FIG. 7 illustrates a routing 140 where the first sub-span (from A to B') is routed in a horizontal-vertical manner, as is the second sub-span (from B' to C). FIG. 8 illustrates a routing 142 where the first sub-span is routed in a horizontal-vertical manner, and the second sub-span is routed in a vertical-horizontal manner. FIG. 9 illustrates a routing 144 where the first sub-span is routed in a vertical-horizontal manner, and the second sub-span is routed in a horizontal-vertical manner. FIG. 10 illustrates a routing 146 where both of the sub-spans are routed in a vertical-horizontal manner.

It may therefore be seen that, through the selection of an intermediate point at different points within the rectangular area bounded by an L-shaped span, as well as the selection among multiple routings through such an intermediate point, a wide variety of alternative routings may be generated for any particular L-shaped span. As a result, buffers that are added along the routes disposed in the optimized Steiner tree will be distributed throughout the bounding rectangle instead of bunching all along an original L-shaped route.

It will be appreciated that algorithm 100 of FIG. 4 is but one of an innumerable number of possible algorithms capable of selectively re-routing at least a portion of an L-shaped span through a bounding rectangle.

For example, algorithm 100 as illustrated is a repeatable algorithm, which generates a repeatable, yet pseudo-random routing for any given set of coordinates. By doing so, an optimization method may be utilized to test several different potential optimizations and select the best solution, e.g., through a trial and error approach. Given that such implementations typically undo the results of particular optimizations after they are performed and tested, a best optimization may be revisited, with the same routes regenerated so that the optimization can be reapplied.

In other embodiments, however, a purely random and non-repeatable algorithm may be used. However, even if a random algorithm is used, where repeatability is desired, the selected intermediate point and selected routing generated by such a random algorithm could be recorded after an optimization is performed so that the results of the optimization could be reapplied at a later time.

Moreover, with respect to algorithm 100, it should be appreciated that fewer or more routings, as well as alternate placements of an intermediate point, and the use of multiple intermediate points, may also be envisioned. Also, pseudo-random values may be based upon less than all of the coordinates for a span, or may be based upon other parameters of a span. Still other algorithms that are not based upon the basic fundamentals of algorithm 100 (i.e., selection of an intermediate point, and selection of multiple routings through such a point) may also be used consistent with the invention. In general, any algorithm that is capable of re-routing at least a portion of a route between any two adjacent non-orthogonal points in a routing tree may be used in the alternative. The invention is therefore not limited to the specific algorithm disclosed herein.

Various additional modifications may be made to the illustrated embodiments without departing from the spirit and scope of the invention. Therefore, the invention lies in the claims hereinafter appended.

What is claimed is:

1. A computer-implemented method of generating a physical design for an integrated circuit, the method comprising:
  (a) generating a routing tree for an integrated circuit design, including applying a congestion relief algorithm to a plurality of L-shaped spans defined in the routing tree, wherein applying the congestion relief algorithm to a first L-shaped span among the plurality of L-shaped spans includes rerouting the first L-shaped span at least partially within a rectangular area bounded by the first L-shaped span, wherein the first L-shaped span includes first and second end points that are unchanged by rerouting of the first L-shaped span; and
  (b) automatically inserting buffers into the integrated circuit design using the routing tree.

2. The method of claim 1, wherein the congestion relief algorithm randomly reroutes the first L-shaped span.

3. The method of claim 1, wherein the congestion relief algorithm repeatably reroutes the first L-shaped span.

4. The method of claim 1, further comprising automatically routing interconnects for the integrated circuit design after automatically inserting the buffers.

5. The method of claim 1, wherein automatically inserting buffers includes placing each buffer at a location defined by the routing tree.

6. The method of claim 1, wherein generating the routing tree further includes generating an un-optimized routing tree, and wherein applying the congestion relief algorithm to the plurality of L-shaped spans is performed after generation of the un-optimized routing tree.

7. The method of claim 6, wherein generating the un-optimized routing tree includes generating a Steiner tree.

8. The method of claim 1, wherein applying the congestion relief algorithm to the plurality of L-shaped spans is performed prior to generation of a complete routing tree.

9. The method of claim 1, wherein generating the routing tree and automatically inserting buffers are performed after laying out circuit elements in the integrated circuit design.

10. A computer-implemented method of generating a physical design for an integrated circuit, the method comprising:
  (a) generating a routing tree for an integrated circuit design, including applying a congestion relief algorithm to a plurality of L-shaped spans defined in the routing tree, wherein applying the congestion relief algorithm to a first L-shaped span among the plurality of L-shaped spans includes rerouting the first L-shaped span at least partially within a rectangular area bounded by the first L-shaped span, wherein the first L-shaped span includes first and second end points that are unchanged by rerouting of the first L-shaped span; and
  (b) automatically inserting buffers into the integrated circuit design using the routing tree;
wherein the first L-shaped span further includes a corner point, wherein each end and corner point is assigned coordinates, and wherein the congestion relief algorithm reroutes the first L-shaped span as a function of the coordinates of at least one of the end and corner points.

11. The method of claim 10, wherein the congestion relief algorithm reroutes the first L-shaped span as a function of the coordinates all of the end and corner points.

12. A computer-implemented method of generating a physical design for an integrated circuit, the method comprising:
  (a) generating a routing tree for an integrated circuit design, including applying a congestion relief algorithm to a plurality of L-shaped spans defined in the routing tree, wherein applying the congestion relief algorithm to a first L-shaped span among the plurality of L-shaped spans includes rerouting the first L-shaped span at least partially within a rectangular area bounded by the first L-shaped span, wherein the first L-shaped span includes first and second end points that are unchanged by rerouting of the first L-shaped span; and
  (b) automatically inserting buffers into the integrated circuit design using the routing tree;
wherein the congestion relief algorithm is configured to select an intermediate point within the rectangular area bounded by the first L-shaped span, and to replace the first L-shaped span with first and second L-shaped sub-spans joined at the intermediate point.

13. The method of claim 12, wherein each of the first and second L-shaped sub-spans has first and second end points and a corner point, the first end point of the first L-shaped sub-span located at the first end point of the first L-shaped span, the second end point of the first L-shaped sub-span and the first end point of the second L-shaped sub-span located at the intermediate point, and the second end point of the second L-shaped sub-span located at the second end point of the first L-shaped span.

14. The method of claim 13, wherein the congestion relief algorithm is configured to select between horizontal-vertical routing and vertical-horizontal routing for each of the first and second L-shaped sub-spans.

15. The method of claim 13, wherein the first L-shaped span includes first and second segments respectively extending between the corner point and the first and second end points, wherein the congestion relief algorithm is configured to position the intermediate point along a bisecting line for a longest segment among the first and second segments.

16. A computer-implemented method of generating a physical design for an integrated circuit, the method comprising:
(a) generating a routing tree for an integrated circuit design, including applying a congestion relief algorithm to a plurality of L-shaped spans defined in the routing tree, wherein applying the congestion relief algorithm to a first L-shaped span among the plurality of L-shaped spans includes rerouting the first L-shaped span at least partially within a rectangular area bounded by the first L-shaped span, wherein the first L-shaped span includes first and second end points that are unchanged by rerouting of the first L-shaped span; and
(b) automatically inserting buffers into the integrated circuit design using the routing tree;
wherein generating the routing tree further includes identifying a L-shaped span suitable for application of the congestion relief algorithm by detecting two adjacent non-orthogonal points in the routing tree and determining that an orthogonal distance between the two adjacent non-orthogonal points exceeds a length threshold.

17. An apparatus, comprising:
(a) a processor; and
(b) program code configured to be executed by the processor to generate a physical design for an integrated circuit by generating a routing tree for an integrated circuit design and automatically inserting buffers into the integrated circuit design using the routing tree, wherein the program code is configured to generate the routing tree at least in part by applying a congestion relief algorithm to a plurality of L-shaped spans defined in the routing tree, and wherein the program code is configured to apply the congestion relief algorithm to a first L-shaped span among the plurality of L-shaped spans by rerouting the first L-shaped span at least partially within a rectangular area bounded by the first L-shaped span, wherein the first L-shaped span includes first and second end points that are unchanged by rerouting of the first L-shaped span.

18. The apparatus of claim 17, wherein the congestion relief algorithm is configured to randomly reroute the first L-shaped span.

19. The apparatus of claim 17, wherein the congestion relief algorithm is configured to repeatably reroute the first L-shaped span.

20. The apparatus of claim 17, wherein the program code is further configured to automatically route interconnects for the integrated circuit design after automatically inserting the buffers.

21. The apparatus of claim 17, wherein the program code is configured to automatically insert buffers by placing each buffer at a location defined by the routing tree.

22. The apparatus of claim 17, wherein the program code is configured to generate the routing tree by generating an un-optimized routing tree, and applying the congestion relief algorithm to the plurality of L-shaped spans after generation of the un-optimized routing tree.

23. The apparatus of claim 22, wherein the program code is configured to generate the un-optimized routing tree by generating a Steiner tree.

24. The apparatus of claim 17 the program code is configured to apply the congestion relief algorithm to the plurality of L-shaped spans prior to generation of a complete routing tree.

25. The apparatus of claim 17, wherein the program code is configured to generate the routing tree and automatically insert buffers after layout of circuit elements in the integrated circuit design.

26. An apparatus, comprising:
(a) a processor; and
(b) program code configured to be executed by the processor to generate a physical design for an integrated circuit by generating a routing tree for an integrated circuit design and automatically inserting buffers into the integrated circuit design using the routing tree, wherein the program code is configured to generate the routing tree at least in part by applying a congestion relief algorithm to a plurality of L-shaped spans defined in the routing tree, and wherein the program code is configured to apply the congestion relief algorithm to a first L-shaped span among the plurality of L-shaped spans by rerouting the first L-shaped span at least partially within a rectangular area bounded by the first L-shaped span, wherein the first L-shaped span includes first and second end points that are unchanged by rerouting of the first L-shaped span;
wherein the first L-shaped span further includes a corner point, wherein each end and corner point is assigned coordinates, and wherein the congestion relief algorithm is configured to reroute the first L-shaped span as a function of the coordinates of at least one of the end and corner points.

27. The apparatus of claim 26, wherein the congestion relief algorithm is configured to reroute the first L-shaped span as a function of the coordinates all of the end and corner points.

28. An apparatus, comprising:
(a) a processor; and
(b) program code configured to be executed by the processor to generate a physical design for an integrated circuit by generating a routing tree for an integrated circuit design and automatically inserting buffers into the integrated circuit design using the routing tree, wherein the program code is configured to generate the routing tree at least in part by applying a congestion relief algorithm to a plurality of L-shaped spans defined in the routing tree, and wherein the program code is configured to apply the congestion relief algorithm to a first L-shaped span among the plurality of L-shaped spans by rerouting the first L-shaped span at least partially within a rectangular area bounded by the first L-shaped span, wherein the first L-shaped span includes first and second end points that are unchanged by rerouting of the first L-shaped span;
wherein the congestion relief algorithm is configured to select an intermediate point within the rectangular area bounded by the first L-shaped span, and to replace the first L-shaped span with first and second L-shaped sub-spans joined at the intermediate point.

29. The apparatus of claim 28, wherein each of the first and second L-shaped sub-spans has first and second end points and a corner point, the first end point of the first L-shaped sub-span located at the first end point of the first L-shaped span, the second end point of the first L-shaped sub-span and the first end point of the second L-shaped sub-span located at the intermediate point, and the second end point of the second L-shaped sub-span located at the second end point of the first L-shaped span.

30. The apparatus of claim 29, wherein the congestion relief algorithm is configured to horizontal-vertical routing and vertical-horizontal routing for each of the first and second L-shaped sub-spans.

31. The apparatus of claim 29, wherein the first L-shaped span includes first and second segments respectively extending between the corner point and the first and second end points, wherein the congestion relief algorithm is configured to position the intermediate point along a bisecting line for a longest segment among the first and second segments.

32. An apparatus, comprising:

(a) a processor; and (b) program code configured to be executed by the processor to generate a physical design for an integrated circuit by generating a routing tree for an integrated circuit design and automatically inserting buffers into the integrated circuit design using the routing tree, wherein the program code is configured to generate the routing tree at least in part by applying a congestion relief algorithm to a plurality of L-shaped spans defined in the routing tree, and wherein the program code is configured to apply the congestion relief algorithm to a first L-shaped span among the plurality of L-shaped spans by rerouting the first L-shaped span at least partially within a rectangular area bounded by the first L-shaped span, wherein the first L-shaped span includes first and second end points that are unchanged by rerouting of the first L-shaped span;

wherein the program code is further configured to identify a L-shaped span suitable for application of the congestion relief algorithm by detecting two adjacent non-orthogonal points in the routing tree, and determining that an orthogonal distance between the two adjacent non-orthogonal points exceeds a length threshold.

33. A program product, comprising:

(a) program code configured to generate a physical design for an integrated circuit by generating a routing tree for an integrated circuit design and automatically inserting buffers into the integrated circuit design using the routing tree, wherein the program code is configured to generate the routing tree at least in part by applying a congestion relief algorithm to a plurality of L-shaped spans defined in the routing tree, and wherein the program code is configured to apply the congestion relief algorithm to a first L-shaped span among the plurality of L-shaped spans by rerouting the first L-shaped span at least partially within a rectangular area bounded by the first L-shaped span wherein the first L-shaped span includes first and second end points that are unchanged by rerouting of the first L-shaped span; and (b) a signal bearing medium bearing the program code.

34. The program product of claim 33, wherein the signal bearing medium includes at least one of a transmission medium and a recordable medium.

* * * * *